(12) United States Patent
Lüllau et al.

(10) Patent No.: US 6,211,948 B1
(45) Date of Patent: Apr. 3, 2001

(54) PROCESS AND APPARATUS FOR PHOTOMECHANICAL PRODUCTION OF STRUCTURED SURFACES, ESPECIALLY FOR IRRADIATION OF OFFSET PRESS PLATES

(75) Inventors: Friedrich Lüllau, Bardowick; Claus Mayer, Scharnebeck; Rolf Lüllau, Adendorf, all of (DE)

(73) Assignee: Friedrich Luellau, Bardowick (DE)

( * ) Notice: Subject to any disclaimer, the term of this patent is extended or adjusted under 35 U.S.C. 154(b) by 0 days.

(21) Appl. No.: 08/700,505
(22) PCT Filed: Feb. 21, 1995
(86) PCT No.: PCT/EP95/00632
 § 371 Date: Aug. 21, 1996
 § 102(e) Date: Aug. 21, 1996
(87) PCT Pub. No.: WO95/22787
 PCT Pub. Date: Aug. 24, 1995

(30) Foreign Application Priority Data

Feb. 21, 1994 (DE) .................................................. 44 05 888

(51) Int. Cl.[7] .................................................. G03B 27/72
(52) U.S. Cl. .................................................. 355/71; 355/40
(58) Field of Search .................... 355/40, 55, 67–71, 355/72, 74, 35, 37, 38, 46

(56) References Cited

U.S. PATENT DOCUMENTS

| 4,769,680 | * | 9/1988 | Resor, III et al. ...................... 355/43 |
| 4,959,683 | * | 9/1990 | Otake et al. ............................ 355/28 |
| 4,963,919 | * | 10/1990 | Matsumoto et al. .................. 355/40 |
| 5,309,273 | * | 5/1994 | Mori et al. ............................ 359/202 |

FOREIGN PATENT DOCUMENTS

2217862 * 1/1989 (GB) .

* cited by examiner

Primary Examiner—Safet Metjahic
Assistant Examiner—John Chizmar
(74) Attorney, Agent, or Firm—Michael J. Striker

(57) ABSTRACT

The invention relates to a process for the photomechanical production of structured surfaces on a pattern support as an image for an electronically stored original, in particular for exposing offset print plates. The invention further relates to a device for carrying out the process. The original is broken down electronically into partial images which are displayed successively on a liquid crystal screen and reproduced on the pattern support such that the images recombine to form a total image of the original on the design support. The information in a partial image is checked and the partial image is reproduced on the pattern support according to this check.

32 Claims, 8 Drawing Sheets

Figure 1:
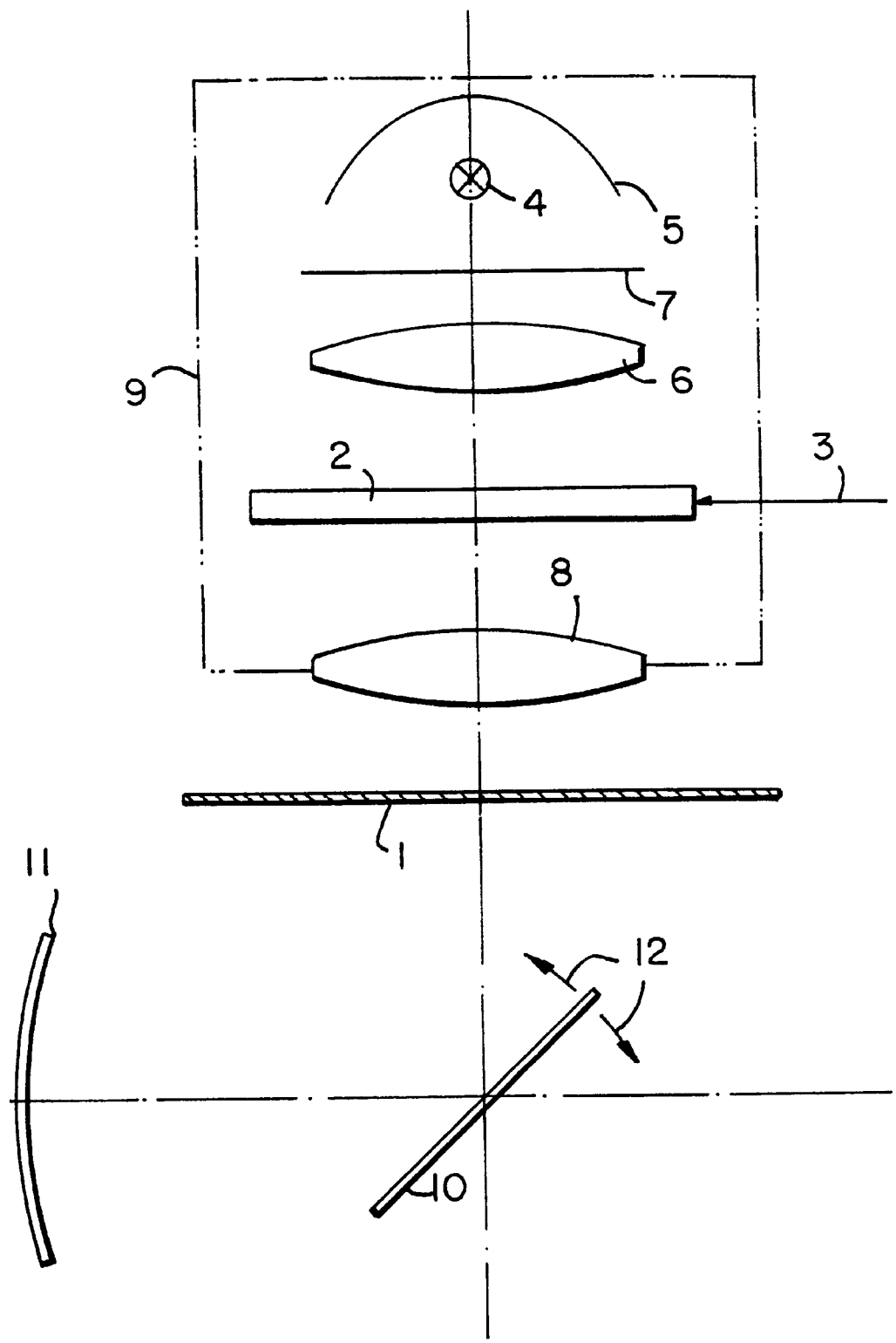

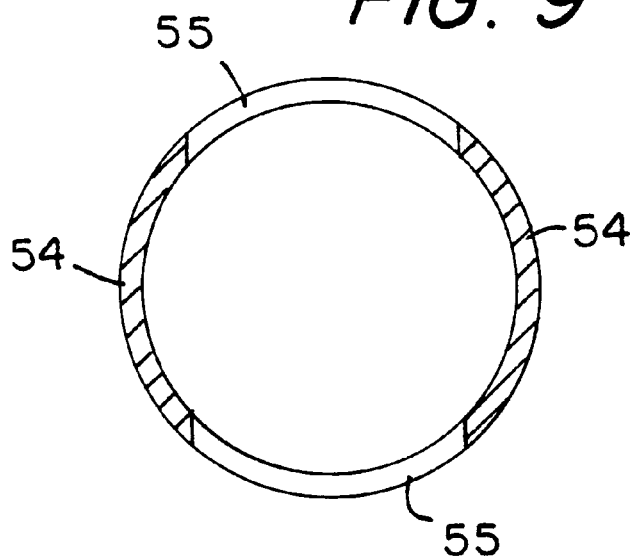
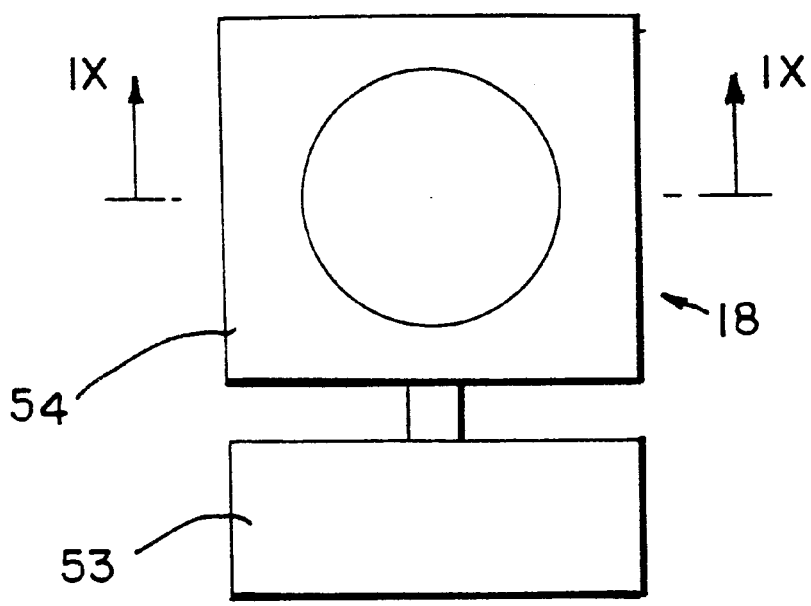

PROCESS AND APPARATUS FOR PHOTOMECHANICAL PRODUCTION OF STRUCTURED SURFACES, ESPECIALLY FOR IRRADIATION OF OFFSET PRESS PLATES

The invention relates to a process for photomechanical production of structured surfaces on a pattern carrier as a copy of an electronically stored model, especially for irradiation of offset press plates, in that the model is broken apart electronically into fragmentary images, and the fragmentary images are represented in succession on a liquid crystal screen and copied on the pattern carrier in such a way that the copies combine again on the pattern carrier to form a total copy of the model.

The invention also relates to an apparatus for photomechanical production of structured surfaces, especially for irradiating offset press plates, having a light source, a digitally stored model, and a pattern carrier, in particular of an offset press plate, in which the model can be displayed on a liquid crystal screen and can be copied onto the pattern carrier by means of an optical component provided in the beam path, wherein the copy and the pattern carrier are embodied as movable relative to one another in at least one axis.

Still today, up to 90% of offset press plates are irradiated with film models using contact copier technology, or individually with production systems as well. This means that before an offset press plate can be irradiated, a film model is prepared. The process step for preparing the film model disadvantageously increases the time and expense of putting pictures on offset press plates.

To solve this problem, German Patent Disclosure DE-A 37 08 147 has disclosed a process of the generic type in question. The photoplotter described there holds a sheet of light-sensitive material for the sake of irradiation from an associated light source. A light valve arrangement inserted between the light source and the sheet has a main surface parallel to the sheet that is subdivided into many subregions or copies, whose light transmissivities are controlled individually by an associated computer to assure that the irradiation is in fact that of a desired graphic illustration or work.

German Patent Disclosure DE-A 38 13 398 also proposes a process and an apparatus according to which and with which the process for producing a light mask for irradiation of offset press plates is simplified and shortened. To generate a latent image, for one of the photosensitive offset press plates, by means of a beam transmitted by a light source and modulated by means of a light mask, the light mask is embodied as a light valve matrix and triggered with signals that correlate with the image. A display of the desired image is thus produced in the form of light spots on an liquid crystal layer, and the display is copied onto the photosensitive coating of an offset press plate.

Finally, from German Patent Disclosure DE-A 28 12 206, an optical printer with a light source and a template, disposed between the light source and the photosensitive recording carrier, for forming the characters to be printed; the template is embodied as a light switching mask by integrated thin-film technology, and the light switching elements of the mask are electrically controllable by a character generator and as a result are transparent as needed at predetermined character raster points to the light transmitted constantly by the light source.

The known processes have not become established thus far, because in practice they prove to be too slow and to lack quality. Especially in the preparation of offset press plates for printing newspapers, the known processes are unsuitable, since the sequential irradiation leads to intolerable timing bottlenecks and poorer-quality printing plates.

The object of the invention is to disclose a process and an apparatus of the type referred to at the outset that furnish better-quality offset press plates with reduced irradiation times.

In a process of this type, this object is attained in that the information content of a fragmentary image is investigated, and as a function of this investigation copying of the fragmentary image onto the pattern carrier is effected. To that end, the apparatus has an appropriate image information evaluation circuit or software.

It can happen that not all the fragmentary images actually contain image information. According to the invention, therefore, only fragmentary images that have picture contents are transmitted to the pattern carrier. Because of the reduced number of fragmentary images, the total irradiation time is shortened approximately in proportion to the sum of fragmentary images without picture content. The irradiation head approaches every position of a fragmentary image over a meandering path. The total irradiation time still required for the remainder can be further reduced if each fragmentary image is assigned a first data set for its image content and a second data set for its position, and the image content of each fragmentary image is investigated for whether picture information is contained in it, and only coherent data sets with image content are used to generate a succession of control data sets for transfer to a numerical controller. As a result, the times required between the individual irradiation times for changing positions between two irradiation locations can also be reduced.

The time for offset press plate preparation can be shortened by a further travel reduction, in that the quantity of the second data sets is sorted such that the smallest possible sum of individual spacings between the positions of the fragmentary images results, and the data sets are transferred in this order to the numerical controller. In this way, the total image is prepared over the shortest possible process path.

High motion speeds of the irradiation head are attained if at least one electric linear drive is used as the drive to generate a relative motion between the pattern carrier and the liquid crystal screen. The thus-shortened positioning times can be followed, without a waiting period, by the irradiation times, because the effects of elasticity, play and friction, on the one hand, and natural oscillation on the other are largely averted by the electric linear drive.

Since offset press plates may have a waviness that is sometimes greater than 2 mm, and since these irregularities are also variously distributed, adequate sharpness or depth of focus in the copy must be attained by choosing suitably small apertures. The low light yield, however, lengthens the irradiation times for the fragmentary image. To shorten these irradiation times, it is contemplated that before each copying of a fragmentary image, a measurement of the spacing from the pattern carrier is made, and deviations from a previously inlet value are automatically corrected. In this way, with a substantially shallow depth of field, high copy quality can be attained in short irradiation times even in wavy plates. The correction can preferably be done by moving the entire irradiation head. In this way, even variously thick offset press plates can be irradiated. The focal length may be corrected accordingly as well, however, although this can cause copying errors.

Uniform copying quality over the entire surface of the model is attained if for the copying, a light source is used whose luminous flux is measured, and deviations from the predetermined luminous flux are automatically corrected.

This correction can either be made by making the correction by varying the irradiation time, or by varying an electrical supply to the light source.

Even the most high-quality printing models can be produced by the process, if the liquid crystal screen is copied on an altered, preferably reduced scale. By suitable reduction of the liquid crystal screen, resolutions of 2540 dpi, for instance, can be attained. However, the model must then also be broken up into correspondingly many fragmentary images, which are irradiation in succession and joined together to form the total model. Because of the thus-increased number of individual irradiations, the total irradiation time for the model rises considerably.

If positioning of the fragmentary images is effected with an accuracy of better than 5 $\mu$m and in particular better than 2 $\mu$m, then the individual fragmentary images adjoin one another without gaps between them.

The total irradiation time for a model can be reduced by providing that a plurality of fragmentary images are copied simultaneously.

Collisions between different irradiation heads are avoided by providing that a relative motion of a plurality of copies with respect to the pattern carrier is effected synchronously. The spacing of the fragmentary images, arranged one after the other and copied simultaneously, remains advantageously constant. Since the likelihood that both irradiation heads will simultaneously lack any picture content drops, and at the same time one irradiation position can be skipped, it is advantageous if the irradiation heads can be moved independently of one another within a predetermined boundary region.

Because a spacing between two simultaneously irradiated copies is variable, models with different resolutions can be irradiated with the same irradiation device. The spacing between two simultaneous copies amounts to an integral multiple of the individual image dimensions.

An especially uniform outcome of irradiation is obtained if the light source is operated constantly and the luminous flux is switched by means of the shutter that preferably rotates about a rotary axis perpendicular to the beam path.

Especially good results are attained if the fragmentary image is generated by means of a raster image processor by a frequency raster method.

Greater uniformity of the transitions is attained by providing that the fragmentary images are copied, overlapping one another. In the region of the overlaps from the edge of the images to the interior, the degree of blackening is adapted, rising linearly, so that as a result of the superposition, a distribution corresponding to the original image is produced.

The object in terms of the apparatus is attained in that a measuring and closed-loop control device is provided for measuring and controlling the spacing from the pattern carrier. Before each irradiation, the spacing from the pattern carrier is ascertained by the measuring instrument. Known laser measuring instruments, for instance, are suitable as the measuring instrument. The spacing is measured by interferometric length measurement. However, the spacing measurement can also be done by known acoustical or optical measuring methods. By comparison with a predetermined command value, a control variable is determined that then readjusts the spacing via a suitable actuator. This may for instance also be done by adjusting the focal length or by adjusting the height of the irradiation head or parts of it using a motor. Because of the closed-loop control provided according to the invention, light sources can be used that sweep a large angle of space, so that because of the high light yield short irradiation times are possible.

The entire model is copied with uniform quality over the entire surface, if a sensor for measuring the luminous flux and a closed control loop for correcting deviations in the luminous flux from a command value are provided. As a result, even slow changes in the light yield cannot have any influence on the outcome of the work.

For instance, changes that make themselves felt over a relatively long period of time can be corrected by providing that an adjusting device for varying an irradiation time is provided in the control loop. The sensor for measuring the luminous flux is preferably disposed in the vicinity of the pattern carrier, so that the luminous flux arriving at the pattern carrier is detected a single time, before the irradiation of the fragmentary images begins.

Brief transient changes that arise for instance from fluctuations in the supply voltages furnished by the power grid, can be compensated for if an adjusting device for varying the luminous flux is provided in the control loop. Preferably, the light sensor is disposed in the vicinity of the light source, or the supply voltage is measured directly. The supply voltage can thus be kept constant by means of known circuits, for instance.

Frequent switching can be averted if a shutter is provided for switching the luminous flux. The service life of the lamp is thus increased.

The shutter times can advantageously be changed quickly, because the shutter is embodied as a rotating body, with a rotary axis that is disposed substantially perpendicular to the beam path. It is provided that the rotating body is embodied partially as a cylinder with cutouts. Such a body in fact has an advantageously slight moment of inertia and moreover allows a compact design. As the drive, a brushless direct current drive is preferably provided.

Further shortening of the irradiation time can be attained if the irradiation head has optical elements, which are of quartz glass. Such glass has advantageously high light transmissivity in the ultraviolet spectral range of the light, so that the UV-light-sensitive offset press plates can be irradiated in a shorter length of time.

Especially high motion speeds and accelerations can be attained if instead of pattern carriers together with a necessary deployment plate, the light source, screen and optical component are combined into an irradiation head, which is embodied so as to be movable. More than 10 fragmentary images can thus be positioned and irradiated per second.

An especially advantageously dynamic performance of the entire apparatus is obtained if at least one drive for generating a relative motion between the irradiation head and the pattern carrier is embodied as a linear drive. Such drives have high positioning accuracy, which is better than 2 $\mu$m.

If the screen is assigned a polarization filter, which is embodied separately from the screen, then especially strong light sources can also be used, since the heat developed in the individual components can more easily be dissipated over the resultant large surface area.

The total model can be completed in still less time if a plurality of irradiation heads are disposed on one axis.

An especially favorable construction is obtained if each irradiation head is assigned its own linear drive, and for the other axis, one common linear drive for all the irradiation heads is provided. It is accepted into the bargain that in one axis the locking speed is somewhat less than that of the two heads in the other direction. This has only a slight effect on the total irradiation time. Because each irradiation head has its own linear drive in the other direction, a quick switchover to different resolutions can be done by moving the irradiation heads in such a way that a larger or smaller space in between results. The copying scale of the liquid crystal screen is altered accordingly. This can be done by changing the focal length.

A construction in which the optical component is embodied as a mirror system has the advantage that at the high frequencies of individual irradiations, fewer oscillations are induced in the entire apparatus, because of the low structural height, and this improves the dynamic performance of the apparatus.

A liquid crystal screen that is embodied as an active liquid crystal screen has proved to be especially suitable. As a result, advantageously high contrast values are attained, which even in projection enable surprisingly good copy quality.

If the beam path is embodied as deflectable, preferably by means of a mirror, then even curved offset press plates can be irradiated.

To that end, it is provided that the pattern carrier is embodied as curved.

Particularly when a liquid crystal projection display, which is embodied as an active display, is used, it suffices if the liquid crystal screen is embodied as acting as an irradiation shutter.

The pattern carriers can be deployed conveniently and their flatness improved if it has a deployment table for pattern carriers that is embodied as a suction table.

The invention will be described in a preferred embodiment with reference to a drawing, and other advantageous details can also be learned from the drawing. Functionally identical elements are provided with the same reference numerals.

Figure 2:
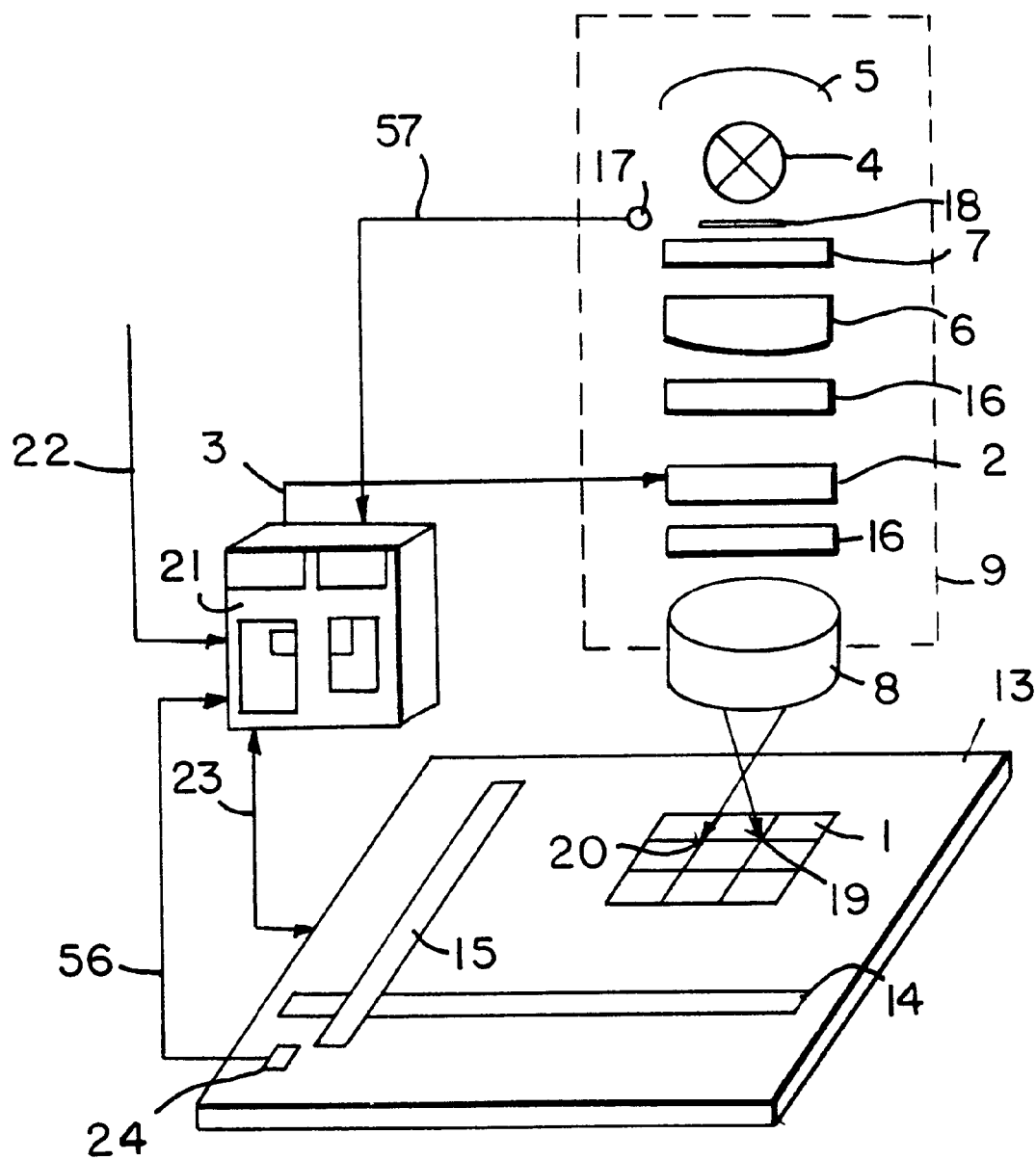
Figure 3:
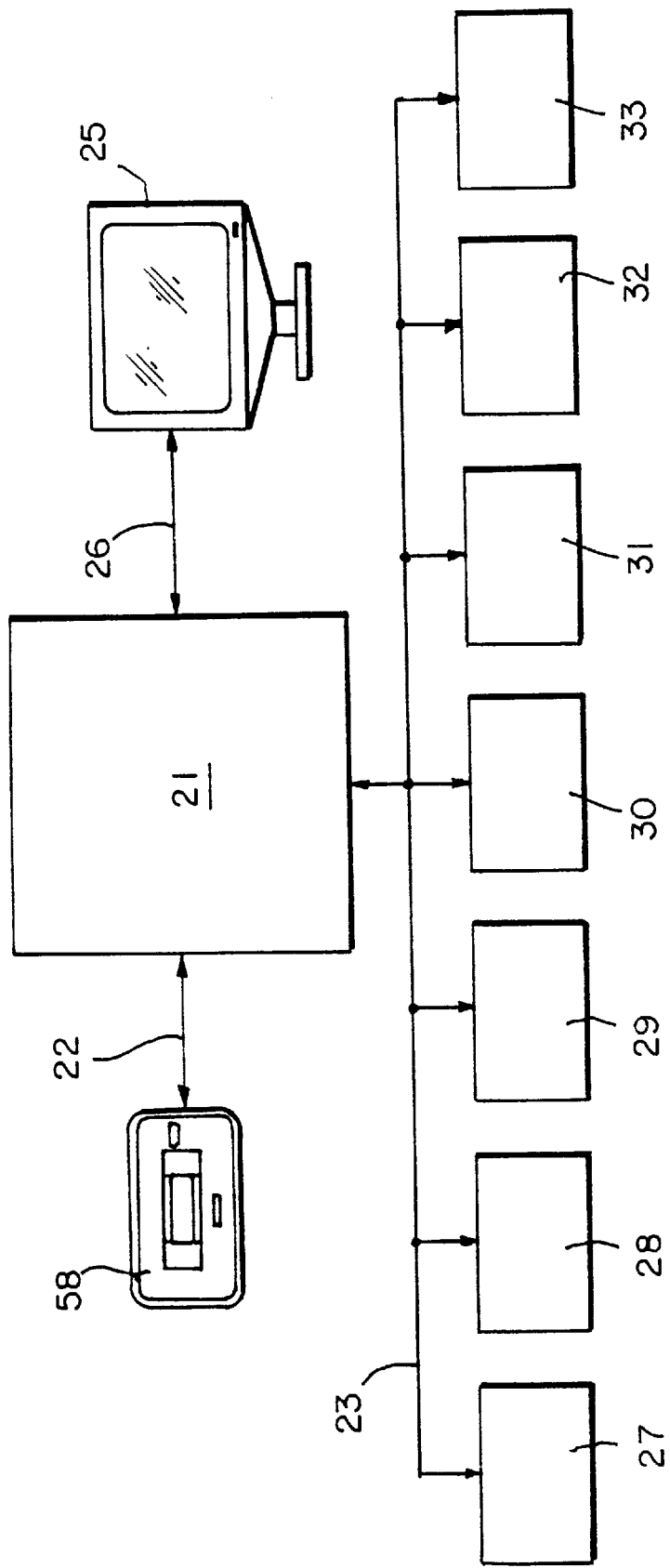
Figure 4:
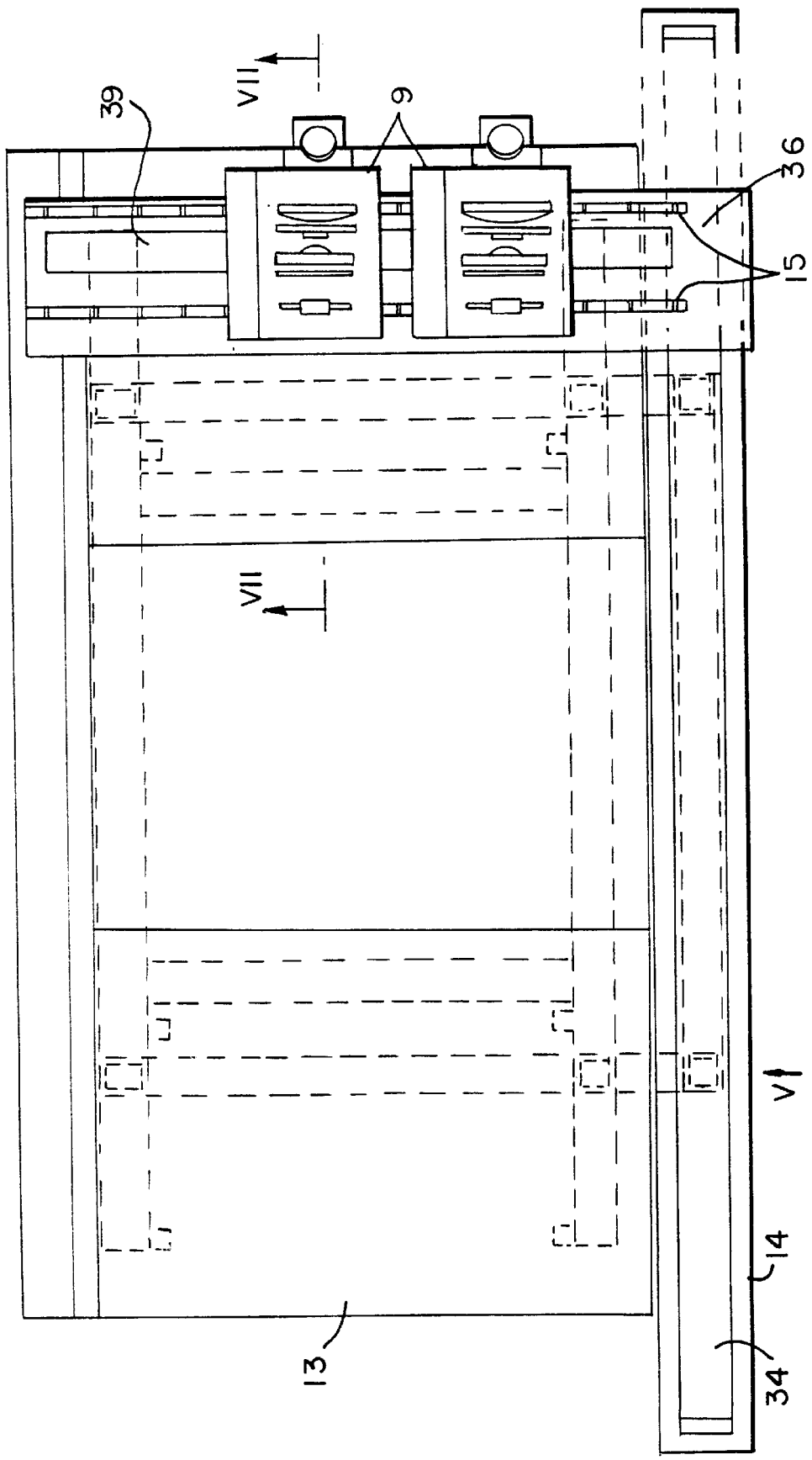
Figure 5:
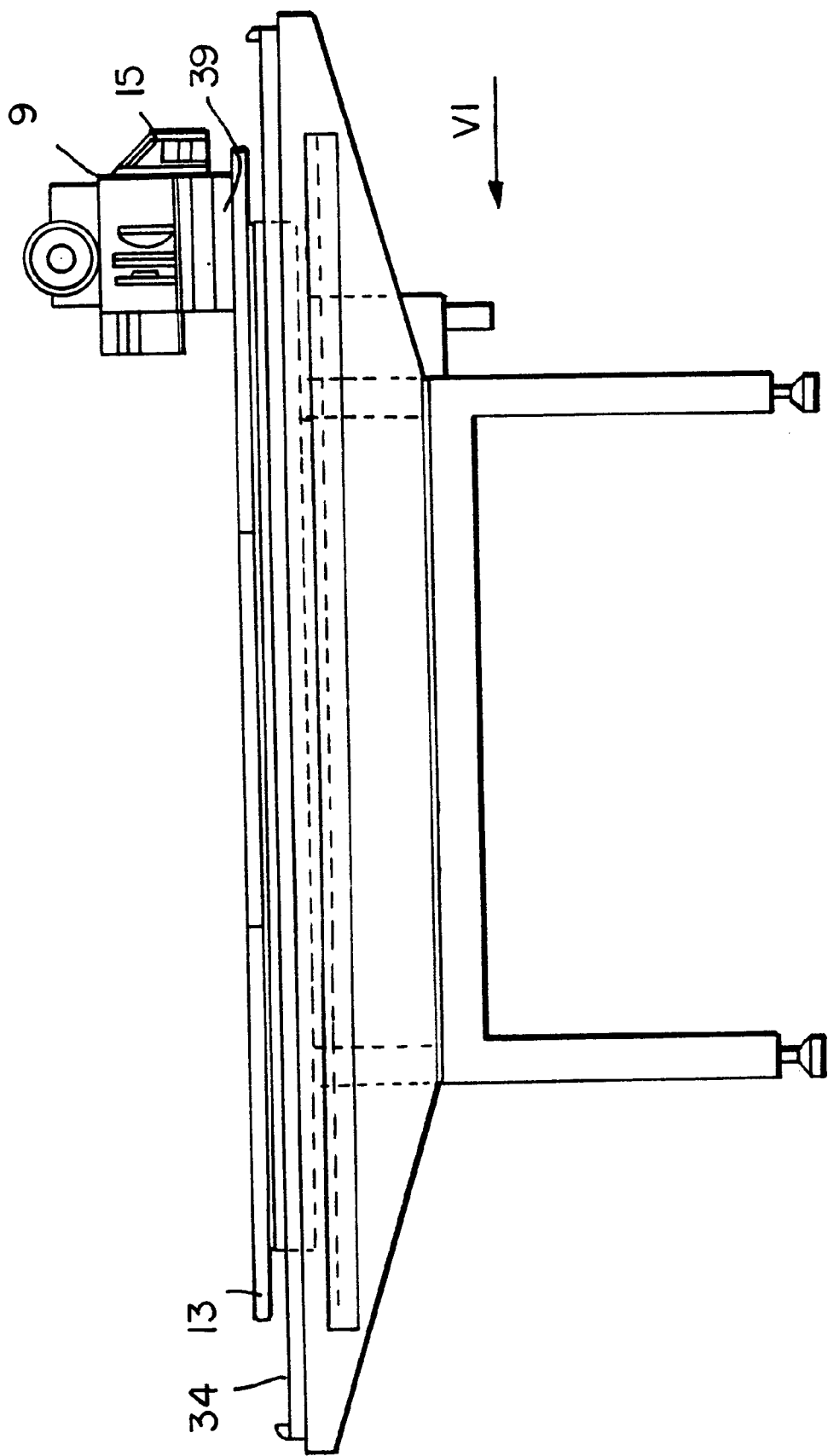
Figure 6:
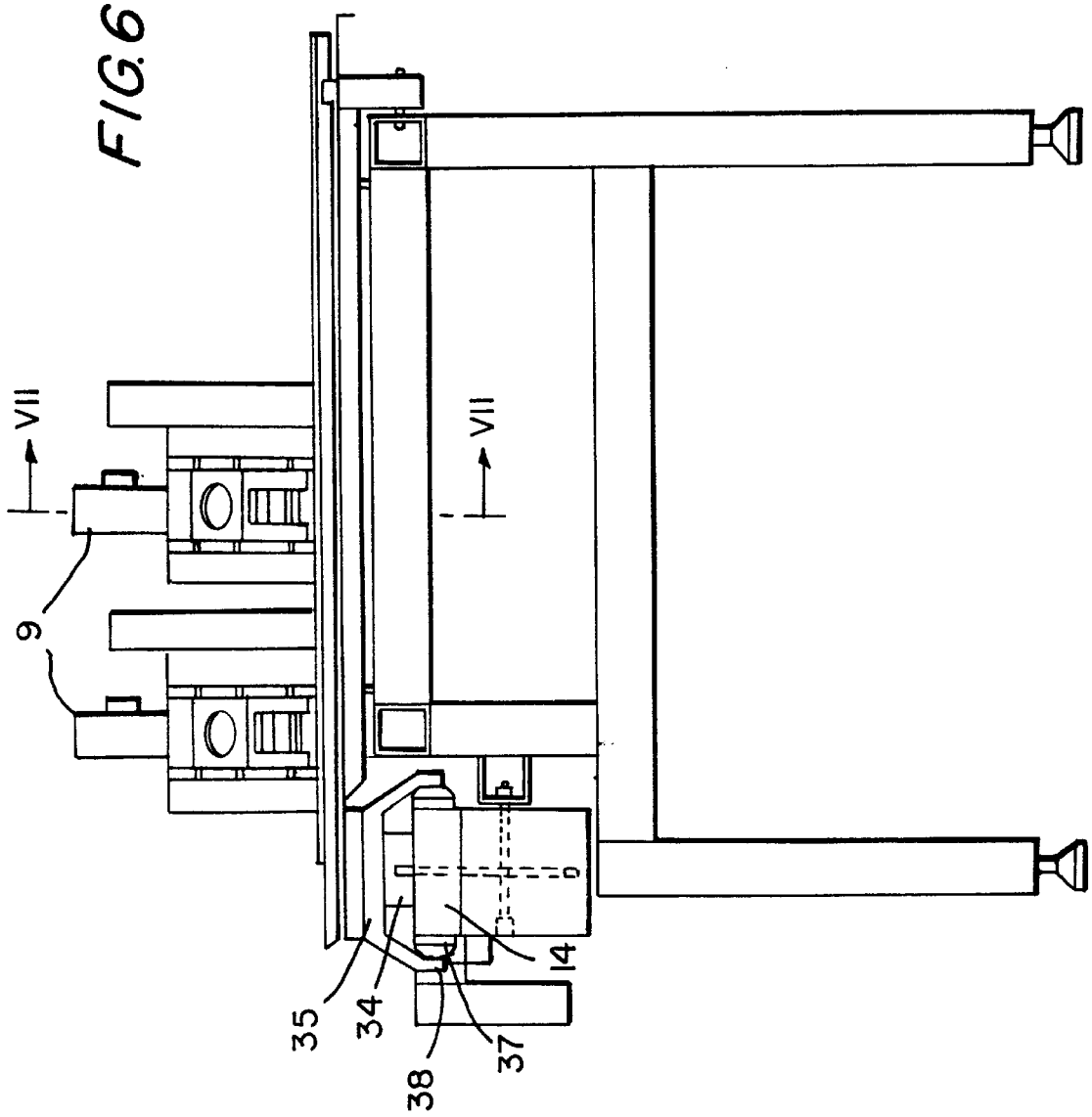
Figure 7:
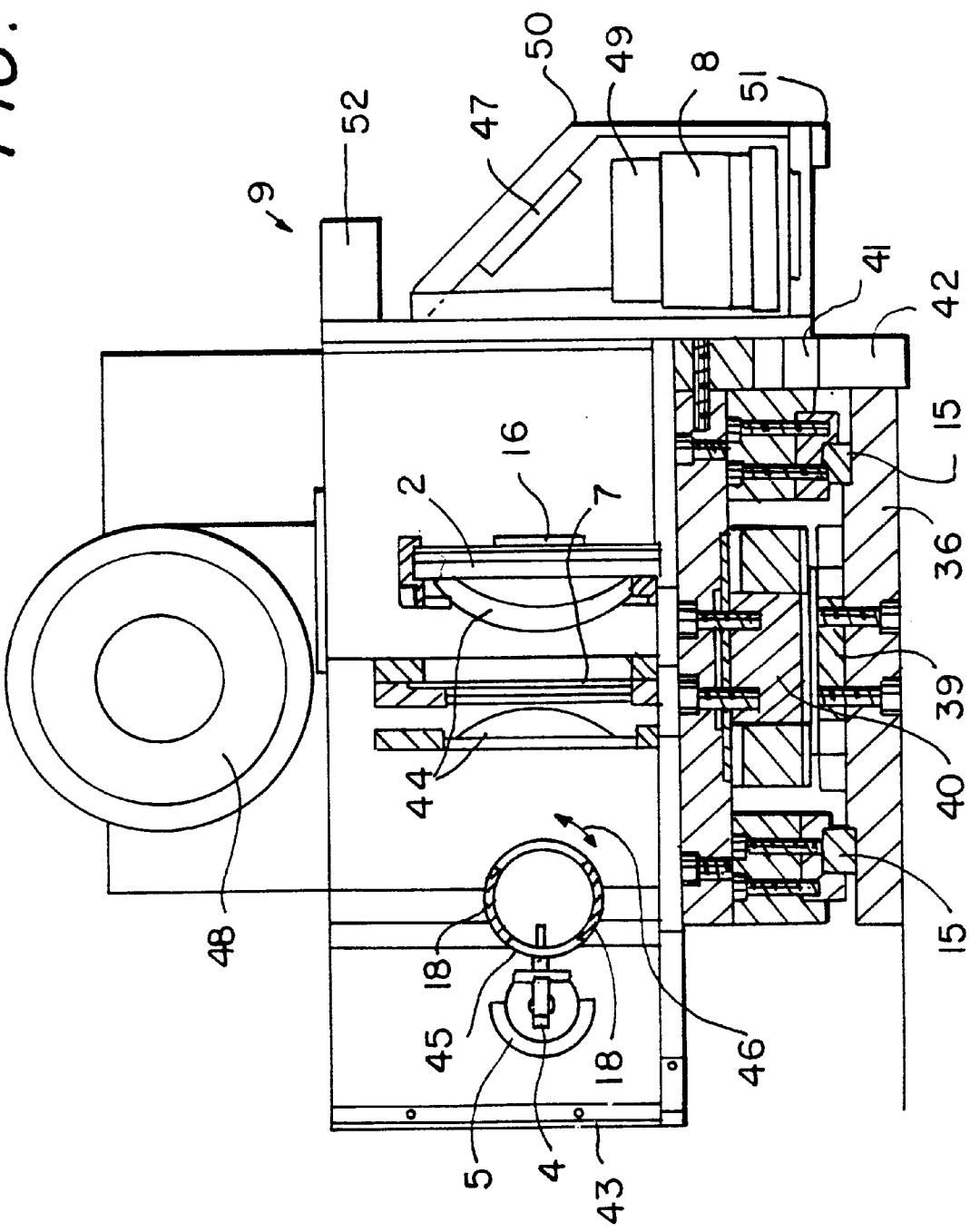

The figures in detail show the following:

FIG. 1, a schematic vertical section through the apparatus of the invention, with two alternative embodiments;

FIG. 2, a schematic perspective view of the irradiation device;

FIG. 3, a block circuit diagram with function groups of the electronic control system;

FIG. 4, a plan view on an irradiation device;

FIG. 5, a side view of the irradiation device in the direction of the arrow V of FIG. 4;

FIG. 6, a further side view of the irradiation device in the direction of the arrow VI of FIG. 5;

FIG. 7, a vertical section through an irradiation head in the direction of the arrows VII—VII of FIG. 6;

FIG. 8, a side view of the shutter; and

FIG. 9, a horizontal section through the shutter.

In FIG. 1, reference numeral 1 indicates an offset press plate to be irradiated. A model to be copied on this press plate is stored digitally in a computer, not shown in the drawing. By means of suitable programs, the model is broken down into fragmentary images and is rendered visible in a known manner via a control line 3 on a 2.

To irradiate the press plate 1, a light source 4 with a reflector 5 is disposed above the liquid crystal screen; its beam is optically focused to infinity by a collimator 6 and in this way projected onto the liquid crystal screen. Between the collimator 6, of which only one lens is schematically suggested, and the light source, a filter 7 is also disposed in the beam path, intended essentially for filtering out the long-wave infrared radiation, so that predominantly the ultraviolet light component that is emitted by the light source can be utilized for the irradiation. As the light source, a metal halide radiator can preferably be used.

A second optical component 8 is used for reduced-size copying of the pattern visible on the liquid crystal screen 2.

For the irradiation, the light source is briefly supplied with adequate current for the required amount of light. This mode of operation, using appropriate flash equipment, has the advantage of a reduced power loss compared with continuous operation.

Alternatively, however, a known shutter may also be provided, which with a corresponding control unit determines the irradiation time.

The light source 4, with the reflector 5, filter 7, collimator 6, liquid crystal screen 2, and optical component 8, and any additional favorable optical components, optionally light shutter systems and cooling systems, are advantageously combined in an irradiation head 9.

After the irradiation of a fragmentary image, the irradiation head 9 is displaced relative to the press plate 1 by the raster dimension corresponding to the fragmentary image portion. The irradiation of the next fragmentary image is done in such a way that the fragmentary images follow one another without gaps so that their picture contents are added together to make the total image.

The guidance of the irradiation locations over the surface of the press plate can alternatively also be done by means of a pivotable mirror 10. To avoid copying errors, a curved deployed press plate 11 is then provided, instead of the planar press plate 1 shown in FIG. 1. The mirror 10 disposed in the beam path casts the light onto this press plate 11. For the ensuing irradiation, it is pivoted by a suitable angle increment in the direction of the arrows 12. Then the next irradiation operation is affected.

It is possible to copy models, prepared with the aid of modern data processing systems, directly onto a print carrier. The costs for preparing a film and the attendant time expenditure are omitted.

FIG. 2 again schematically and partly in perspective shows the irradiation device of the invention. The pattern carrier 1 is fixed on a deployment plate 13. In this deployment plate 13, guides for the X axis 14 and for the Y axis 15 are permanently joined, arranged orthogonally to one another. The movable irradiation head 9 can be moved along the guides 14, 15 by means of electric linear drives, not shown.

In addition to the irradiation head shown in FIG. 1, polarization filters 16 are provided, separately from the liquid crystal screen 2; they are made from a material that absorbs as little light as possible in the ultraviolet spectral range. In addition, the thermal burden on the liquid crystal screen 2 is reduced. As the light source 4, a metal halide lamp is provided, which must be operated for a certain length of time before it reaches its full power. The luminous flux originating at the light source 4 is measured by means of a light sensor 17 and is forwarded to the triggering electronics via a signal line 57. Depending on the measured intensity of the luminous flux, the irradiation is specified, and a shutter 18 provided between the light source 4 and the filter 7 is opened for the duration of the irradiation time. in this way, a first fragmentary image 19 on the pattern carrier is irradiated. Next, the irradiation head 9 is displaced by one image division, for instance in the direction of the X axis 14, and a further fragmentary image, in the form of a copy of the pattern shown on the liquid crystal screen 2, is irradiated.

To generate the requisite patterns for this on the liquid crystal screen, triggering electronics 21 are provided, which via a control line 3 show the corresponding pattern on the liquid crystal screen before each irradiation of a fragmentary image. Data entry into the triggering electronics 21 is done for instance via a data line 22, which informs the triggering electronics of the requisite image contents and their position. Via a signal line 23, the triggering electronics 21 trigger drives, not shown individually, for moving the irradiation head 9.

As an alternative or in addition to the light sensor 17, a light sensor 24 may also be provided on the deployment plate; it is approached once before the pattern carrier is irradiated and measures the luminous flux originating at the light source 4. The signal of the light sensor 24 is supplied via a signal line 56 to a closed control loop, which regulates the irradiation time or the power grid supply to the light source. The light sensor 24 has the advantage that it measures the actual luminous flux arriving at the pattern carrier, so that even optical quality of the components that varies over long periods of time can also be detected and corrected.

FIG. 3 shows the electronic control schematically in the form of individual blocks.

The models provided for the printing are broken down electronically into fragmentary images by means of a raster image processor and are buffer-stored on a magnetooptical data carrier. As such, it can be read by means of a magnetooptical drive 58 connected to the triggering electronics 21 of the irradiation device and can furnish the data required for the control. Additional entries and commands can be made via a control terminal 25, which is also connected via a data line 26 to the triggering electronics 21. The various function units 27–33 are linked to the triggering electronics 21 via the signal line 23 embodied as a field.

The triggering electronics 21 exchange data with the function groups 27–33 of the irradiation device over the signal line 23. From a spacing measurement 27, embodied for instance as a laser distance measuring device 51, the triggering electronics 21 learn the current spacing from the pattern carrier. If deviations from a previously set command value occur, then a corresponding adjustment command to the function group for spacing control or focal width adjustment 28 is generated, so that the spacing or focal length is then corrected accordingly, so as to achieve the greatest possible sharpness of the copy on the pattern carrier. Correspondingly, the outcome of an irradiation measurement 29 is compared with a preset command value, and a corresponding correction signal to the shutter control 30 or light source control 33 is generated. The instantaneous location of the irradiation heads is imparted to the control by measurement heads, which read the scales disposed on the axes. The control generates the necessary movement signals for the drive motors. These functions are combined as a block for the drive control 31.

In FIGS. 4, 5 and 6, the mechanical construction of the irradiation device is shown. A guide for the X axis 14 is joined permanently to the deployment plate 13. The secondary part 34 of a first electric linear drive is secured to the guide 14. While the primary part 35 is secured to a carriage 36. As a result, the carriage 36 can be moved along the guide 14 in the direction of the X axis. A scale 37 (FIG. 6) is additionally provided, which is read by a measuring head 38 (FIG. 6) mounted on the carriage 36. These parts belong to a linear travel measuring system, known per se, which reports the position of the carriage 36 to the triggering electronics 21.

On the carriage 36, which extends over the full width of the deployment plate 13, two guide rails 15 are provided, along which two irradiation heads 9 are movable. To that end, a secondary part 39 of a second electric linear drive is secured to the carriage 36. Belonging to each irradiation head 9 is its own primary part 40 of the second electric linear drive. The electric linear drives are embodied as synchronous drives. The second linear drives also include linear travel measuring systems, which report the position of the irradiation heads back to the triggering electronics 21. To this end, a corresponding scale 42 (FIG. 7) is provided in the direction of the guide 15 on the carriage 36, and it is scanned by measuring heads 41 (FIG. 7) secured to the irradiation heads 9.

FIG. 7 shows a vertical section through one of the irradiation heads 9. In a housing 43, a lens system 44 is provided for copying the resultant pattern on the liquid crystal screen 2. To this end, the luminous flux of the light source 4 is first aimed horizontally through the reflector 5 at the shutter 18. The shutter 18 is rotatable in the direction of the arrow 46, so that the openings 45 provided in the shutter 18 can switch the luminous flux. The light is then aimed by the lens system 44 at the liquid crystal screen 2 and filtered by the filter 7. After passing through the liquid crystal screen 2, the beams strike the mirror 47, which orients the beam path by 90° onto the optical component 8, which finally copies the image onto the pattern carrier.

To eliminate the heat produced in the housing 43, a blower 48 is disposed on top of the housing 43. Because of the vertical disposition of the parts in the housing 43, the heat can be well dissipated in this way. The mirror 47 and the objective 49 are built into their own housing 50, which is secured vertically displaceably to the housing 43. A distance measuring head 51 disposed on the housing 50 measures the distance from the pattern carrier. Upon deviations from the command value, the location of the housing 15 can be altered by means of an actuator 52 secured to the housing 43. The actuator is embodied as a spindle and nut system; the nut is preferably secured on the housing 50, and the motor and spindle are permanently connected to the housing 43.

Alternatively, the focal length of the objective 49 can be adjusted by a suitable actuator.

FIG. 8 schematically shows the shutter 18. It comprises a motor 53. The motor is preferably embodied as a brushless direct current motor. On its rotary axis, a cylindrical tube segment 54 is provided, into which openings 55 are made that pass through the rotary axis. The hollow cylinder has an advantageously low moment of inertia and makes an especially compact construction of the irradiation head possible.

In addition, an adjustable diaphragm can also be disposed in the beam path, for instance in the form of an iris-type diaphragm, to enable easier adaptation to various photosensitive carrier materials.

List of Reference Numerals 1. press plate
2. liquid crystal screen
3. control line
4. light source
5. reflector
6. collimator
7. filter
8. optical component
9. irradiation head
10. mirror
11. press plate
12. error
13. deployment plate
14. guidance (in X axis)
15. guidance (in Y axis)

16. polarization filter
17. light sensor
18. shutter
19. fragmentary image
20. fragmentary image
21. control electronics
22. data line
23. signal line
24. light sensor
25. control terminal
26. data line
27. spacing measurement
28. spacing or focal length control
29. irradiation measurement
30. shutter control
31. drive control for linear motors
32. aperture control
33. light source control
34. secondary portion
35. primary portion (first drive)
36. carriage
37. scale
38. measuring head
39. secondary portion
40. primary portion
41. measuring head
42. scale
43. housing
44. lens system
45. openings
46. arrow
47. mirror
48. blower
49. objective
50. housing
51. distance measuring head
52. actuator
53. motor
54. tube segment
55. openings
56. signal line
57. signal line
58. magnetooptical data drive

What is claimed is:

1. A process for photomechanical production of structured surfaces on a pattern carrier as a copy of an electronically stored model, for irradiation of offset press plates, in that the model is broken apart electronically into fragmentary images, and the fragmentary images are represented in succession on a liquid crystal screen and copied on the pattern carrier in such a way that the copies combine again on the pattern carrier to form a total copy of the model, characterized in that each fragmentary image is assigned a first data set for its image content and a second data set for its position, and by means of an image information evaluation circuit or software the image content of each fragmentary image is investigated for whether picture information is contained in it, and as a function of this investigating copying of the fragmentary image onto the pattern carrier is effected, whereby the quantity of the second data sets is sorted such that the smallest possible sum of individual spacings between the positions of the fragmentary images results, and the data sets are transferred in this order to a numerical controller.

2. The process of claim 1, characterized in that at least one electric linear drive is used as the drive to generate a relative motion between the pattern carrier and the liquid crystal screen.

3. The process of claim 1, characterized in that before each copying of a fragmentary image, a measurement of the spacing from the pattern carrier is made, and deviations from a previously inlet value are automatically corrected.

4. The process of claim 1, characterized in that for the copying, a light source is used whose luminous flux is measured, and deviations from the predetermined luminous flux are automatically corrected.

5. The process of claim 1, characterized in that the correction is effected by varying the irradiation time.

6. The process of claim 1, characterized in that the correction is effected by varying an electrical supply to the light source.

7. The process of claim 1, characterized in that the liquid crystal screen is copied on an altered, preferably reduced scale.

8. The process of claim 1, characterized in that positioning of the fragmentary images is effected with an accuracy of better than 5 $\mu$m and in particular better than 2 $\mu$m.

9. The process of claim 1, characterized in that a plurality of fragmentary images are copied simultaneously.

10. The process of claim 1, characterized in that a relative motion of a plurality of copies with respect to the pattern carrier is effected synchronously.

11. The process of claim 1, characterized in that a spacing between two simultaneously irradiated copies is variable.

12. The process of claim 1, characterized in that the luminous flux is switched by means of the shutter that preferably rotates about a rotary axis perpendicular to the beam path.

13. The process of claim 1, characterized in that the fragmentary image is generated by means of a raster image processor by a frequency raster method.

14. The process of claim 1, characterized in that the fragmentary images are copied, overlapping one another.

15. An apparatus for photomechanical production of structured surfaces, for irradiating offset press plates, having a light source, a digitally stored model, and a pattern carrier, being of an offset press plate, in which the model can be displayed on a liquid crystal screen and is copied onto the pattern carrier (1) by means of an optical component (8) provided in the beam path between the liquid crystal screen and the pattern carrier, wherein the copy and the pattern carrier are embodied as movable relative to one another in at least one axis, characterized in that a measuring and closed-loop control device (28) is provided for measuring and controlling the spacing of the liquid crystal screen or an irradiation head from the pattern carrier (1); the light source (4), screen (2) and optical component (8) are combined into an irradiation head (9), which is embodied as movable; and at least one drive for generating a relative motion between the irradiation head and the pattern carrier is embodied as a linear drive (34, 35, 39, 40).

16. The apparatus of claim 15, characterized in that a sensor (17, 24) for measuring the luminous flux and a closed control loop (30, 33) for correcting deviations in the luminous flux from a command value are provided.

17. The apparatus of claim 15 or, characterized in that an adjusting device (30) for varying an irradiation time is provided in the control loop.

18. The apparatus of claim 15, characterized in that an adjusting device (33) for varying the luminous flux is provided in the control loop.

19. The apparatus of claim 15, characterized in that a shutter (18) is provided for switching the luminous flux.

20. The apparatus of claim 15, characterized in that the shutter (18) is embodied as a rotating body (54), with a rotary axis that is disposed substantially perpendicular to the beam path.

21. The apparatus of claim 15, characterized in that the rotating body (54) is embodied partially as a cylinder with cutouts.

22. The apparatus of claim 15, characterized in that a brushless direct current drive is provided as the drive (53) of the shutter.

23. The apparatus of claim 15, characterized in that the irradiation head (9) has optical elements (6, 7, 8, 44), which are of quartz glass.

24. The apparatus of claim 15, characterized in that the screen (2) is assigned a polarization filter (16), which is embodied separately from the screen.

25. The apparatus of claim 15, characterized in that a plurality of irradiation heads (9) are disposed on one axis.

26. The apparatus of claim 15, characterized in that each irradiation head (9) is assigned its own linear drive (39, 40), and for the other axis, one common linear drive (34, 35) for all the irradiation heads (9) is provided.

27. The apparatus of claim 15, characterized in that the optical component (8) is embodied as a mirror system.

28. The apparatus of claim 15, characterized in that the liquid crystal screen (2) is embodied as an active liquid crystal screen.

29. The apparatus of claim 15, characterized in that the beam path is embodied as deflectable, preferably by means of a mirror (10).

30. The apparatus of claim 15, characterized in that the pattern carrier (11) is embodied as curved.

31. The apparatus of claim 15, characterized in that the liquid crystal screen (2) is embodied as acting as an irradiation shutter.

32. The apparatus of claim 15, characterized in that it has a deployment table (13) for pattern carriers that is embodied as a suction table.

* * * * *